(12) United States Patent
Kelly et al.

(10) Patent No.: US 11,181,016 B2
(45) Date of Patent: Nov. 23, 2021

(54) SYSTEMS AND METHODS FOR A CRANK SENSOR HAVING MULTIPLE SENSORS AND A MAGNETIC ELEMENT

(71) Applicant: Honda Motor Co., Ltd., Tokyo (JP)

(72) Inventors: Sean M. Kelly, Hilliard, OH (US); Philip R. Weber, Columbus, OH (US)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 17/062,277

(22) Filed: Oct. 2, 2020

(65) Prior Publication Data

US 2021/0017887 A1 Jan. 21, 2021

Related U.S. Application Data

(63) Continuation-in-part of application No. 16/987,889, filed on Aug. 7, 2020, which is a continuation-in-part
(Continued)

(51) Int. Cl.
*F01L 13/00* (2006.01)
*G01R 33/09* (2006.01)

(52) U.S. Cl.
CPC .......... *F01L 13/0042* (2013.01); *G01R 33/09* (2013.01); *F01L 2013/0084* (2013.01)

(58) Field of Classification Search
CPC .......... F01L 13/0042; F01L 2013/0084; G01R 33/09; G01R 33/091; G01R 33/072;
(Continued)

(56) References Cited

U.S. PATENT DOCUMENTS

| 3,979,161 A | 9/1976 | Kremer et al. |
| 4,116,175 A * | 9/1978 | Sand ..................... F02P 5/1455 123/406.42 |

(Continued)

FOREIGN PATENT DOCUMENTS

| CN | 203223516 U | 10/2013 |
| CN | 203780034 U | 8/2014 |

(Continued)

OTHER PUBLICATIONS

"2011-17 Mustang Ford Performance High RPM Competition Ignition Pulse Ring 5.0." Late Model Restoration. (Accessed Jun. 16, 2020.).
(Continued)

*Primary Examiner* — Joseph J Dallo
(74) *Attorney, Agent, or Firm* — Rankin, Hill & Clark LLP

(57) ABSTRACT

Embodiments for crankshaft tooth sensing are provided. A method may include identifying a first tooth characteristic of a tooth of a plurality of teeth on the crank pulse wheel. The first tooth characteristic is identified by a first sensor element sensing along a first axis of a magnetic field and identifying a second tooth characteristic of the tooth with a second sensor element sensing along a second axis of the magnetic field. The method also includes identifying a tooth type for the tooth based on the first tooth characteristic and the second tooth characteristic. The method further includes identifying a sliding buffer for a set of N teeth of the plurality of teeth on the crank pulse wheel. A buffer value is calculated for the sliding buffer corresponding to the N set of teeth. The angular position of the crank pulse wheel is determined based on the buffer value.

20 Claims, 12 Drawing Sheets

Related U.S. Application Data of application No. 16/657,134, filed on Oct. 18, 2019, which is a continuation-in-part of application No. 16/271,087, filed on Feb. 8, 2019.

(58) Field of Classification Search
CPC .............. Y02T 10/40; F02D 2041/283; F02D 2200/101; F02D 41/222; F02D 41/009
See application file for complete search history.

(56) References Cited

U.S. PATENT DOCUMENTS

| | | | |
|---|---|---|---|
| 4,121,112 A | 10/1978 | Hartig | |
| 4,138,976 A * | 2/1979 | Crall | F02P 5/1558 |
| | | | 123/406.59 |
| 4,518,918 A | 5/1985 | Avery | |
| 4,528,471 A | 7/1985 | Baumann | |
| 4,535,289 A | 8/1985 | Abe et al. | |
| 4,827,800 A | 5/1989 | Pedersen et al. | |
| 4,935,698 A | 6/1990 | Kawaji et al. | |
| 5,070,727 A | 12/1991 | David et al. | |
| 5,084,674 A | 1/1992 | Lachmann et al. | |
| 5,182,943 A | 2/1993 | Fukui et al. | |
| 5,444,370 A | 8/1995 | Wu | |
| 5,623,412 A | 4/1997 | Masson et al. | |
| 5,694,040 A | 12/1997 | Plagens | |
| 5,794,171 A | 8/1998 | Bryant et al. | |
| 5,856,922 A | 1/1999 | Jehanno | |
| 5,870,688 A | 2/1999 | Kanbara et al. | |
| 6,012,551 A | 1/2000 | Raab | |
| 6,062,071 A | 5/2000 | Henn et al. | |
| 6,175,233 B1 | 1/2001 | McCurley et al. | |
| 6,199,426 B1 | 3/2001 | Shibagaki | |
| 6,341,253 B1 | 1/2002 | Honda | |
| 6,346,808 B1 | 2/2002 | Schroeder | |
| 6,404,188 B1 | 6/2002 | Ricks | |
| 6,474,278 B1 | 11/2002 | Davis et al. | |
| 6,490,914 B1 | 12/2002 | Brandenburg et al. | |
| 6,566,867 B1 | 5/2003 | Schroeder et al. | |
| 6,609,498 B2 | 8/2003 | Mathews et al. | |
| 6,737,861 B2 | 5/2004 | Lantto | |
| 6,752,009 B2 | 6/2004 | Minich et al. | |
| 6,978,666 B1 | 12/2005 | Wu et al. | |
| 7,069,774 B2 | 7/2006 | Nakamura et al. | |
| 7,096,593 B2 | 8/2006 | Schmied | |
| 7,116,096 B2 | 10/2006 | Waszkowski et al. | |
| 7,135,856 B2 | 11/2006 | Eidenvall et al. | |
| 7,167,793 B1 | 1/2007 | Gibson et al. | |
| 7,458,164 B2 | 12/2008 | Perret et al. | |
| 7,942,041 B2 | 5/2011 | Takeuchi | |
| 8,085,036 B2 | 12/2011 | Ausserlechner | |
| 8,120,351 B2 | 2/2012 | Rettig et al. | |
| 8,978,453 B2 | 3/2015 | Fayyad et al. | |
| 9,297,321 B2 | 3/2016 | Hawken et al. | |
| 9,297,346 B2 | 3/2016 | Wang | |
| 9,303,972 B2 | 4/2016 | Oberhauser et al. | |
| 9,465,087 B2 | 10/2016 | Klotzbuecher et al. | |
| 9,568,310 B2 | 2/2017 | Stuckert et al. | |
| 9,765,711 B2 | 9/2017 | Martinson | |
| 9,938,921 B2 | 4/2018 | Hagari et al. | |
| 10,036,653 B2 | 7/2018 | Hernandez-Oliver | |
| 10,184,860 B2 | 1/2019 | Schweikert et al. | |
| 10,234,513 B2 | 3/2019 | Vig et al. | |
| 10,254,103 B2 | 4/2019 | Taylor et al. | |
| 10,260,906 B2 | 4/2019 | Liu et al. | |
| 10,428,752 B2 | 10/2019 | Mazenc et al. | |
| 2002/0093202 A1 | 7/2002 | Downs et al. | |
| 2003/0168044 A1 | 9/2003 | Rupp et al. | |
| 2004/0020472 A1 | 2/2004 | Bayerle et al. | |
| 2005/0061293 A1 | 3/2005 | Chung et al. | |
| 2005/0285592 A1 | 12/2005 | Taniguchi et al. | |
| 2006/0089784 A1 | 4/2006 | Spicer et al. | |
| 2006/0150938 A1 | 7/2006 | Kramer | |
| 2007/0068015 A1 | 3/2007 | Perret et al. | |
| 2007/0170913 A1 | 7/2007 | Yokotani et al. | |
| 2008/0022760 A1 | 1/2008 | McDaniel et al. | |
| 2008/0027622 A1 * | 1/2008 | McDaniel | F02D 41/009 |
| | | | 701/102 |
| 2008/0125929 A1 | 5/2008 | Prokhorov | |
| 2008/0173079 A1 | 7/2008 | McGee et al. | |
| 2009/0276143 A1 | 11/2009 | Rackmil et al. | |
| 2009/0301179 A1 | 12/2009 | Moessner | |
| 2010/0072988 A1 | 3/2010 | Hammerschmidt et al. | |
| 2010/0107747 A1 | 5/2010 | Rolew et al. | |
| 2011/0048350 A1 | 3/2011 | Simpson et al. | |
| 2011/0213545 A1 | 9/2011 | Oaten et al. | |
| 2012/0271536 A1 | 10/2012 | Hamedovic et al. | |
| 2013/0073182 A1 | 3/2013 | Lindsay et al. | |
| 2013/0082693 A1 | 4/2013 | Boehl | |
| 2013/0096872 A1 | 4/2013 | Boehl | |
| 2013/0151194 A1 | 6/2013 | Hawken et al. | |
| 2013/0180505 A1 | 7/2013 | Schüle et al. | |
| 2014/0019084 A1 | 1/2014 | Rolew et al. | |
| 2014/0060486 A1 | 3/2014 | Maezawa | |
| 2014/0084906 A1 * | 3/2014 | Ruigrok | G01R 33/0011 |
| | | | 324/207.21 |
| 2014/0107904 A1 | 4/2014 | Nefzer et al. | |
| 2014/0232379 A1 * | 8/2014 | Nazarian | G01D 5/145 |
| | | | 324/207.21 |
| 2015/0354479 A1 | 12/2015 | Lindsay et al. | |
| 2015/0369195 A1 | 12/2015 | Wang | |
| 2017/0102291 A1 | 4/2017 | Gladel et al. | |
| 2017/0138281 A1 | 5/2017 | Utley et al. | |
| 2017/0217427 A1 | 8/2017 | Weiβ et al. | |
| 2017/0276740 A1 | 9/2017 | Schmitt et al. | |
| 2017/0292898 A1 | 10/2017 | Schweikert et al. | |
| 2017/0299467 A1 | 10/2017 | Johansson et al. | |
| 2017/0363512 A1 | 12/2017 | Ognibene | |
| 2018/0195453 A1 | 7/2018 | Zhang | |
| 2018/0230865 A1 | 8/2018 | Brown | |
| 2018/0298836 A1 | 10/2018 | Stowasser et al. | |
| 2018/0355815 A1 | 12/2018 | Braun et al. | |
| 2019/0086236 A1 | 3/2019 | Binder et al. | |
| 2019/0301897 A1 | 10/2019 | Kisaichi et al. | |
| 2020/0064156 A1 | 2/2020 | Hirano et al. | |

FOREIGN PATENT DOCUMENTS

| | | |
|---|---|---|
| CN | 206556614 U | 10/2017 |
| DE | 102010041444 | 3/2012 |
| EP | 0071885 | 2/1983 |
| EP | 1544622 | 6/2005 |
| FR | 2843614 A1 | 2/2004 |
| FR | 2894665 | 6/2007 |
| GB | 2343955 | 5/2000 |
| JP | H09231889 | 9/1997 |
| JP | 2004060450 A | 2/2004 |
| JP | 5724337 B2 | 5/2015 |
| WO | WO2018042911 | 3/2018 |

OTHER PUBLICATIONS

"BMW S14 140mm Race with Integral 60-2 Trigger." TTV Racing. (Accessed Jun. 16, 2020.).
"Tone Ring." Rick's Free Auto Repair Advice. (Accessed Jun. 16, 2020.).
Mavrigian, Mike. "Installation and Removal Tips for LS Engine 24x or 58x Reluctor Wheels." OnAllCylinders. Apr. 19, 2018. (Accessed Jun. 16, 2020.).
Office Action of U.S. Appl. No. 16/271,087 dated Mar. 30, 2021, 28 pages.
Notice of Allowance of U.S. Appl. No. 16/657,134 dated Jun. 3, 2021, 29 pages.
Notice of Allowance of U.S. Appl. No. 16/987,889 dated Jul. 8, 2021, 31 pages.
Notice of Allowance of U.S. Appl. No. 16/271,087 dated Aug. 13, 2021, 15 pages.

* cited by examiner

SYSTEMS AND METHODS FOR A CRANK SENSOR HAVING MULTIPLE SENSORS AND A MAGNETIC ELEMENT

RELATED APPLICATIONS

This application is a continuation-in-part of U.S. application Ser. No. 16/987,889 filed on Aug. 7, 2020, a continuation-in-part of U.S. application Ser. No. 16/657,134 filed on Oct. 18, 2019 (now published as U.S. Publication No. US-2020/0256709), and a continuation-in-part of U.S. application Ser. No. 16/271,087 filed on Feb. 8, 2019 (now published as U.S. Publication No. 2020/0256706). U.S. application Ser. No. 16/657,134 is a continuation-in-part of U.S. application Ser. No. 16/271,087 filed on Feb. 8, 2019. This application expressly incorporates by reference herein the above applications.

BACKGROUND

A crankshaft sensor is used to determine the position and timing of an engine of a vehicle. In particular, as a crank pulse wheel of the crankshaft turns, the crankshaft sensor detects tooth pulses corresponding to the teeth of the crank pulse wheel. The tooth pulses correspond to angular positions of the crankshaft so that the appropriate engine timing can be determined based on the position of the crank pulse wheel in combination with camshaft position information. For example, the crank pulse wheel has at least one missing or altered tooth that allows the position of the crank pulse wheel to be indexed and/or determined. However, using missing or altered tooth alone may require prior knowledge of the position of the crankshaft pulse wheel or the crankshaft pulse wheel must rotate past the missing or altered teeth before the crankshaft position can be determined. For example, the crank pulse wheel of the crankshaft may have to rotate 360 degrees before being able to associate a tooth pulse with a particular angular position. Accordingly, determining the position and timing of the engine may require additional time or information.

BRIEF DESCRIPTION

According to one or more aspects, a method for crankshaft tooth sensing for an encoded crank pulse wheel of a vehicle is provided. The method includes identifying a first tooth characteristic of a tooth of a plurality of teeth on the crank pulse wheel with a crankshaft sensor having a magnetic element, a first sensor element, and a second sensor element. The plurality of teeth are arranged in a single track on the crank pulse wheel. The first tooth characteristic, identified by the first sensor element, senses along a first axis of a magnetic field generated by the magnetic element. Referring back to the method, the method also includes identifying a second tooth characteristic of the tooth with the second sensor element that senses along a second axis of the magnetic field generated by the magnetic element. The method further includes identifying a tooth type for the tooth based on the first tooth characteristic and the second tooth characteristic. The method includes identifying a sliding buffer for a set of N teeth of the plurality of teeth on the crank pulse wheel. N is a positive integer less than a total number of teeth of the crank pulse wheel. The method yet further includes calculating a buffer value for the sliding buffer corresponding to the N set of teeth represented in the sliding buffer. The angular position of the crank pulse wheel is determined based on the buffer value.

According to one or more aspects, a non-transitory computer-readable storage medium is provided for storing instructions that, when executed by a computer, cause the computer to perform a method for position determination based on sensing of an encoded crank pulse wheel of a vehicle. The method includes identifying a first tooth characteristic of a tooth of a plurality of teeth on the crank pulse wheel with a crankshaft sensor having a magnetic element, a first sensor element, and a second sensor element. The plurality of teeth are arranged in a single track on the crank pulse wheel. The first tooth characteristic, identified by the first sensor element, is sensed along a first axis of a magnetic field generated by the magnetic element. Referring back to the method, the method also includes identifying a second tooth characteristic of the tooth with the second sensor element that senses along a second axis of the magnetic field generated by the magnetic element. The method further includes identifying a tooth type for the tooth based on the first tooth characteristic and the second tooth characteristic. The method includes identifying a sliding buffer for a set of N teeth of the plurality of teeth on the crank pulse wheel. N is a positive integer less than a total number of teeth of the crank pulse wheel. The method yet further includes calculating a buffer value for the sliding buffer corresponding to the N set of teeth represented in the sliding buffer. The angular position of the crank pulse wheel is then determined based on the buffer value.

According to one or more aspects, a system for crankshaft tooth sensing of an encoded crank pulse wheel of a vehicle is provided. In one embodiment, the system includes a plurality of teeth on the crank pulse wheel, a crankshaft sensor, a processor and memory. The plurality of teeth on the crank pulse wheel arranged in a single track. The crankshaft sensor includes a magnetic element interposed between and separating a first sensor element and a second sensor element. In some embodiments, the first sensor element and the second sensor element are magnetic measurement devices. The memory stores instructions that are executed by the processor and cause the processor to perform a method. The method includes identifying a first tooth characteristic of a tooth of the plurality of teeth on the crank pulse wheel with the first sensor element of the crankshaft sensor that senses a first axis of a magnetic field generated by the magnetic element. The method also includes identifying a second tooth characteristic of the tooth of the plurality of teeth with the second sensor element that senses along a second axis of the magnetic field generated by the magnetic element. The method further includes identifying a tooth type for the tooth based on the first tooth characteristic and the second tooth characteristic. The method yet further includes identifying a sliding buffer for a set of N teeth of the plurality of teeth on the crank pulse wheel. N is a positive integer less than a total number of teeth of the crank pulse wheel. The method includes calculating a buffer value for the sliding buffer corresponding to the N set of teeth represented in the sliding buffer. The angular position of the crank pulse wheel is then determined based on the buffer value.

DETAILED DESCRIPTION

Figure 1:
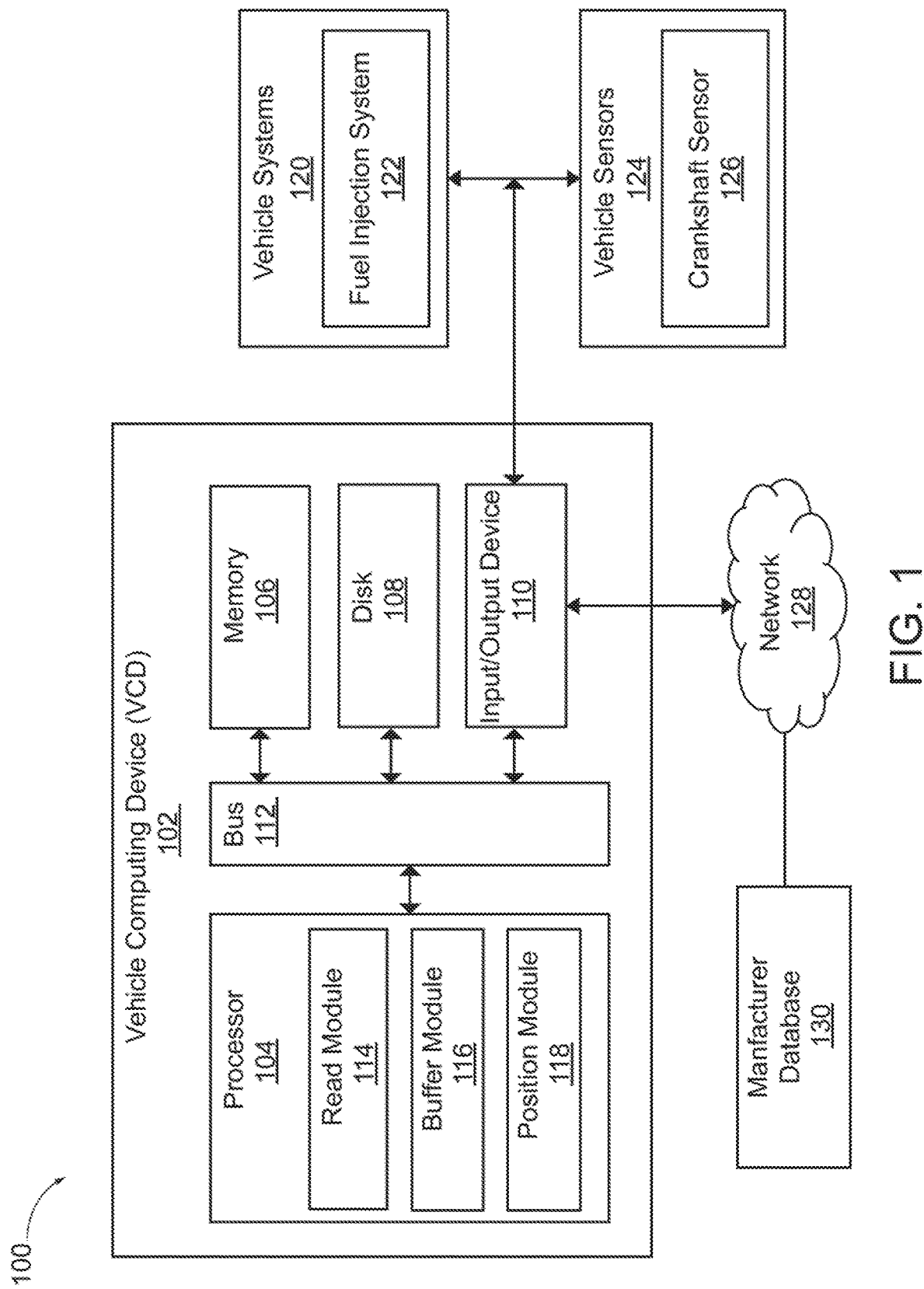
FIG. 1 is a schematic diagram of an operating environment for implementing systems and methods for crankshaft tooth sensing according to one or more embodiments.

Generally, the systems and methods disclosed herein are directed to sensing a crank pulse wheel so that the angular position of the crank pulse wheel can be determined. The more information that can be gleaned from a single tooth on a crank pulse wheel, the fewer teeth on the crank pulse wheel that will need to be sensed to determine the angular position. Here, different types teeth on the crank pulse wheel are distinguished based on tooth characteristics, such as the presence or length of the tooth, whether the tooth is angled or has a protrusion, and/or the color of the tooth, among others.

In one embodiment, a crank pulse sensor can distinguish between the teeth based on the manner in which the crank pulse wheel affects a magnetic field. A crankshaft sensor may include a magnetic element capable of generating a magnetic field. The crankshaft sensor may also include a number of sensors. For example, the crankshaft sensor may include two or more magnetic measurement devices that detect variations in the magnetic field along different axes. Different characteristics in the shape of the teeth are determined based on variations in the magnetic field. For example, suppose that a first axis of the magnetic field is determinative of length while a second axis of the magnetic field is determinative of and angle or bend in the tooth that makes the tooth wider. By measuring variations in the first axis and/or the second axis, it can be determined if the tooth is long or short, or if the tooth has a protrusion that extending in an axial direction from the crank pulse wheel. The sensors of the crankshaft sensor may also include a color sensor that determines the color of at least a portion of a face of the tooth.

Combining two or more of these tooth characteristics confers more information about a single tooth on the crank pulse wheel. The more encoded characteristics that can be determined from the teeth, the fewer teeth of the crank pulse wheel have to be sensed to determine the angular position the crank pulse wheel. For example, there may be only one location on the crank pulse wheel that has a short tooth followed by a long tooth with a protrusion. Accordingly, the system may only have to read two teeth to determine the angular position of the crank pulse wheel, thereby decreasing the amount of time and number of teeth that have to be encoded.

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

Definitions

The following includes definitions of selected terms employed herein. The definitions include various examples and/or forms of components that fall within the scope of a term and that can be used for implementation. The examples are not intended to be limiting.

A "bus," as used herein, refers to an interconnected architecture that is operably connected to other computer components inside a computer or between computers. The bus can transfer data between the computer components. The bus can be a memory bus, a memory controller, a peripheral bus, an external bus, a crossbar switch, and/or a local bus, among others. The bus can also be a mobile programmable agent bus that interconnects components inside a mobile programmable agent using protocols such as Media Oriented Systems Transport (MOST), Controller Area network (CAN), Local Interconnect Network (LIN), among others.

"Component", as used herein, refers to a computer-related entity (e.g., hardware, firmware, instructions in execution, combinations thereof). Computer components may include, for example, a process running on a processor, a processor, an object, an executable, a thread of execution, and a computer. A computer component(s) can reside within a process and/or thread. A computer component can be localized on one computer and/or can be distributed between multiple computers.

"Computer communication," as used herein, refers to a communication between two or more computing devices (e.g., computer, personal digital assistant, cellular telephone, network device, mobile programmable agent, computing device, infrastructure device, security device) and can be, for example, a network transfer, a data transfer, a file transfer, an applet transfer, an email, a hypertext transfer protocol (HTTP) transfer, and so on. A computer communication can occur across any type of wired or wireless system and/or network having any type of configuration, for example, a local area network (LAN), a personal area network (PAN), a wireless personal area network (WPAN), a wireless network (WAN), a wide area network (WAN), a metropolitan area network (MAN), a virtual private network (VPN), a cellular network, a token ring network, a point-to-point network, an ad hoc network, a mobile ad hoc network, a vehicle-to-everything (V2X) network, among others. Computer communication can utilize any type of wired, wireless, or network communication protocol including, but not limited to, Ethernet (e.g., IEEE 802.3), WiFi (e.g., IEEE 802.11), communications access for land mobiles (CALM), WiMax, Bluetooth, Zigbee, ultra-wideband (UWAB), multiple-input and multiple-output (M IMO), telecommunications and/or cellular network communication (e.g., SMS, MMS, 3G, 4G, LTE, 5G, GSM, CDMA, WAVE), satellite, dedicated short range communication (DSRC), among others.

A "database," as used herein can refer to table, a set of tables, a set of data stores and/or methods for accessing and/or manipulating those data stores. Some databases can be incorporated with a disk as defined below.

A "disk," as used herein can be, for example, a magnetic disk drive, a solid-state disk drive, a floppy disk drive, a tape drive, a Zip drive, a flash memory card, and/or a memory stick. Furthermore, the disk can be a CD-ROM (compact disk ROM), a CD recordable drive (CD-R drive), a CD rewritable drive (CD-RW drive), and/or a digital video ROM drive (DVD ROM). The disk can store an operating system that controls or allocates resources of a computing device.

"Logic circuitry," as used herein, includes, but is not limited to, hardware, firmware, a non-transitory computer readable medium that stores instructions, instructions in execution on a machine, and/or to cause (e.g., execute) an action(s) from another logic circuitry, module, method and/or system. Logic circuitry can include and/or be a part of a processor controlled by an algorithm, a discrete logic (e.g., application-specific integrated circuit (ASIC)), an analog circuit, a digital circuit, a programmed logic device, a memory device containing instructions, and so on. Logic can include one or more gates, combinations of gates, or other circuit components. Where multiple logics are described, it can be possible to incorporate the multiple logics into one physical logic. Similarly, where a single logic is described, it can be possible to distribute that single logic between multiple physical logics.

A "memory," as used herein can include volatile memory and/or non-volatile memory. Non-volatile memory can include, for example, ROM (read only memory), PROM (programmable read only memory), EPROM (erasable PROM), and EEPROM (electrically erasable PROM). Volatile memory can include, for example, RAM (random access memory), synchronous RAM (SRAM), dynamic RAM (DRAM), synchronous DRAM (SDRAM), double data rate SDRAM (DDR SDRAM), and direct RAM bus RAM (DRRAM). The memory can store an operating system that controls or allocates resources of a computing device.

A "module," as used herein, includes, but is not limited to, non-transitory computer readable medium that stores instructions, instructions in execution on a machine, hardware, firmware, software in execution on a machine, and/or combinations of each to perform a function(s) or an action(s), and/or to cause a function or action from another module, method, and/or system. A module may also include logic, a software-controlled microprocessor, a discrete logic circuit, an analog circuit, a digital circuit, a programmed logic device, a memory device containing executing instructions, logic gates, a combination of gates, and/or other circuit components. Multiple modules may be combined into one module and single modules may be distributed among multiple modules.

An "operable connection," or a connection by which entities are "operably connected," is one in which signals, physical communications, and/or logical communications can be sent and/or received. An operable connection can include a wireless interface, a physical interface, a data interface, and/or an electrical interface.

A "processor" as used herein, processes signals and performs general computing and arithmetic functions. Signals processed by the processor can include digital signals, data signals, computer instructions, processor instructions, messages, a bit, a bit stream, or other means that can be received, transmitted and/or detected. Generally, the processor can be a variety of various processors including multiple single and multicore processors and co-processors and other multiple single and multicore processor and co-processor architectures. The processor can include various modules to execute various functions.

"Vehicle," as used herein, refers to any moving vehicle that is capable of carrying one or more human occupants and is powered by any form of energy. The term "vehicle" includes, but is not limited to cars, trucks, vans, minivans, SUVs, motorcycles, scooters, boats, go-karts, amusement ride cars, rail transport, personal watercraft, and aircraft. In some cases, a motor vehicle includes one or more engines. Further, the term "vehicle" can refer to an electric vehicle (EV) that is capable of carrying one or more human occupants and is powered entirely or partially by one or more electric motors powered by an electric battery. The EV can include plug-in hybrid electric vehicles (PHEV). The term "vehicle" can also refer to an autonomous vehicle and/or self-driving vehicle powered by any form of energy. The autonomous vehicle can carry one or more human occupants. Further, the term "vehicle" can include vehicles that are automated or non-automated with pre-determined paths or free-moving vehicles.

"Vehicle control system" and/or "vehicle system," as used herein can include, but is not limited to, any automatic or manual systems that can be used to enhance the vehicle, driving, and/or safety. Exemplary vehicle systems include, but are not limited to: an engine control system, an electronic stability control system, an anti-lock brake system, a brake assist system, an automatic brake prefill system, a low speed follow system, a cruise control system, a collision warning system, a collision mitigation braking system, an auto cruise control system, a lane departure warning system, a blind spot indicator system, a lane keep assist system, a navigation system, a transmission system, brake pedal systems, an electronic power steering system, visual devices (e.g., camera systems, proximity sensor systems), an electronic pretensioning system, a monitoring system, a vehicle suspension system, a sensory system, an interior or exterior camera system among others.

I. System Overview

Figure 2:
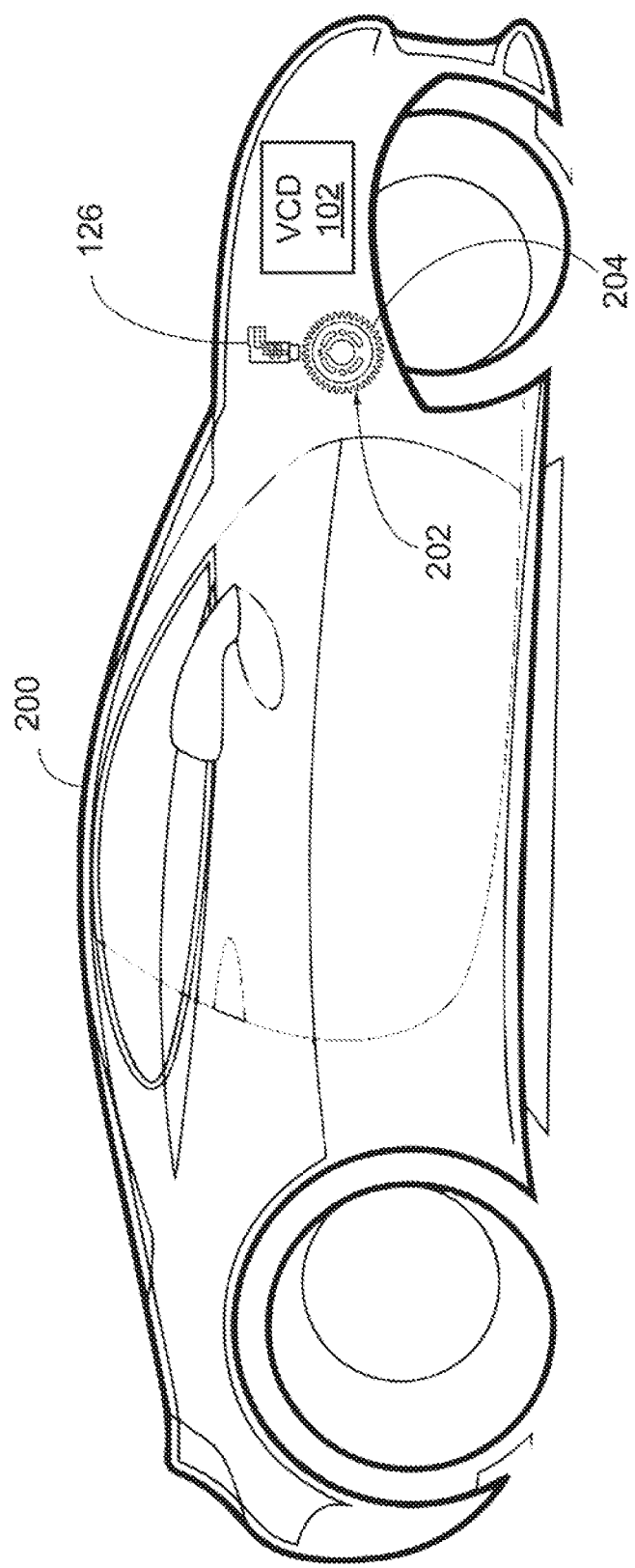
FIG. 2 is a schematic diagram of a crank pulse wheel and a crankshaft sensor according to one or more embodiments.

Referring now to the drawings, wherein the showings are for purposes of illustrating one or more exemplary embodiments and not for purposes of limiting same. FIG. 1 is a schematic diagram of an operating environment 100 for crankshaft tooth sensing of an encoded crank pulse wheel. The components of operating environment 100, as well as the components of other systems, hardware architectures, and software architectures discussed herein, can be combined, omitted, or organized into different architectures for various embodiments. Further, the components of the operating environment 100 can be implemented with or associated with a vehicle 200 and a crank pulse wheel 202, as shown in FIG. 2.

In the illustrated embodiment of FIG. 1, the operating environment 100 includes a vehicle computing device (VCD) 102 with provisions for processing, communicating and interacting with various components of a vehicle, such as vehicle 200, and other components of the operating environment 100. In one embodiment, the VCD 102 can be implemented in the vehicle 200, for example, as part of a telematics unit, a head unit, a navigation unit, an infotainment unit, an electronic control unit, among others. In other embodiments, the components and functions of the VCD 102 can be implemented remotely from the vehicle 200, for example, with a portable device (not shown) or another device connected via a network (e.g., a network 128).

Generally, the VCD 102 includes a processor 104, a memory 106, a disk 108, and an input/output (I/O) interface 110, which are each operably connected for computer communication via a bus 112 and/or other wired and wireless technologies. The I/O interface 110 provides software and hardware to facilitate data input and output between the components of the VCD 102 and other components, networks, and data sources, which will be described herein. Additionally, the processor 104 includes a read module 114, a buffer module 116, and a position module 118 for crankshaft tooth sensing, facilitated by the components of the operating environment 100. The memory 106 may store instructions that when executed by the processor 104 cause the processor to perform in accordance with the read module 114, the buffer module 116, and the position module 118.

The VCD 102 is also operably connected for computer communication (e.g., via the bus 112 and/or the I/O interface 110) to one or more vehicle systems 120. The vehicle systems 120 can include, but are not limited to, any automatic or manual systems that can be used to enhance the vehicle 200, driving, and/or safety. Here, as an example, the vehicle systems 120 include a fuel injection system 122. The fuel injection system 122 delivers fuel to a combustion engine of the vehicle 200 based on synchronized timing to propel the vehicle 200.

The vehicle systems 120 include and/or are operably connected for computer communication to various vehicle sensors 124. The vehicle sensors 124 provide and/or sense information associated with the vehicle 200, the vehicle environment, and/or the vehicle systems 120. Here, the vehicle sensors 124 include a crankshaft sensor 126 for detecting the teeth on a crank pulse wheel 202. In some embodiments, the crankshaft sensor 126 may include magnetic measurement devices, such as a magneto-resistive sensor, Hall Effect sensor, or color sensor. The crankshaft sensor 126 may have a digital output or a variable reluctance sensor having an analog output. In particular, the crankshaft sensor 126 may measure the magnetic flux corresponding to the teeth on the crank pulse wheel 202. The crank pulse wheel 202 has a total number of teeth that extend outward from the main body of the crank pulse wheel 202. A tooth of the total number of teeth may have a profile that is polyhydric, conical, spherical, helical, beveled, crowned, cantilevered, angled, rounded, and/or irregular shaped, among others.

The vehicle sensors 124 can also include, but are not limited to, image sensors, such as cameras, optical sensors, radio sensors, electromagnetic sensors, etc. mounted to the interior or exterior of the vehicle 200. The vehicle sensors 124 may detect characteristics of the engine, such as the position, timing, velocity, etc. of the components. Accordingly, the vehicle sensors 124 are operable to sense a measurement of data associated with the vehicle 200, the vehicle environment, and/or the vehicle systems 120, and generate a data signal indicating said measurement of data. These data signals can be converted into other data formats (e.g., numerical) and/or used by the vehicle systems 120 and/or the VCD 102 to generate other data metrics and parameters. For example, the data signals may convert the sensor data to values that can be used by the VCD 102. It is understood that the sensors can be any type of sensor, for example, acoustic, electric, magnetic, radio, environmental, optical, imaging, light, pressure, force, thermal, temperature, proximity, among others.

The VCD 102 is also operatively connected for computer communication to the network 128. It is understood that the connection from the I/O interface 110 and to the network 128 can be facilitated in various ways. For example, through a network connection (e.g., wired or wireless), a cellular data network from a portable device (not shown), a vehicle to vehicle ad-hoc network (not shown), an in-vehicle network (not shown), among others, or any combination of thereof. The network 128 is, for example, a data network, the Internet, a wide area network or a local area network. The network 128 serves as a communication medium to various remote devices (e.g., databases, web servers, remote servers, application servers, intermediary servers, client machines, other portable devices). For example, the VCD 102 may receive updates from a manufacturer database 130 using the network 128.

The application of systems for and methods for crankshaft tooth sensing are described with respect to the vehicle 200. As shown in FIG. 2, the vehicle 200 includes the operating environment 100, the crank pulse wheel 202, and the crankshaft sensor 126 described above. The crank pulse wheel 202 has teeth, such as tooth 204, having a predetermined geometry defined by at least one tooth characteristic. However, the crank pulse wheel 202 is exemplary in nature and may have more or fewer teeth with different profiles, geometries, and/or configurations on the crank pulse wheel 202.

Using the system and network configuration discussed above, the crankshaft teeth can be encoded to indicate a specific angular position on the crank pulse wheel 202 which can be used to determine the position and timing of the engine of the vehicle 200. In particular, the teeth have different geometries and are ordered such that when the VCD 102 reads a certain fixed number of consecutive teeth, the angular position of the crank pulse wheel 202 can be determined. The order of the teeth on the crank pulse wheel 202 is patterned such that the angular position of the crank pulse wheel 202 can be determined regardless of where on the crank pulse wheel 202 the reading began. Detailed embodiments describing exemplary methods using the system and network configuration discussed above will now be discussed in detail.

II. Application of Systems and Methods for Tooth Sensing

Figure 3:
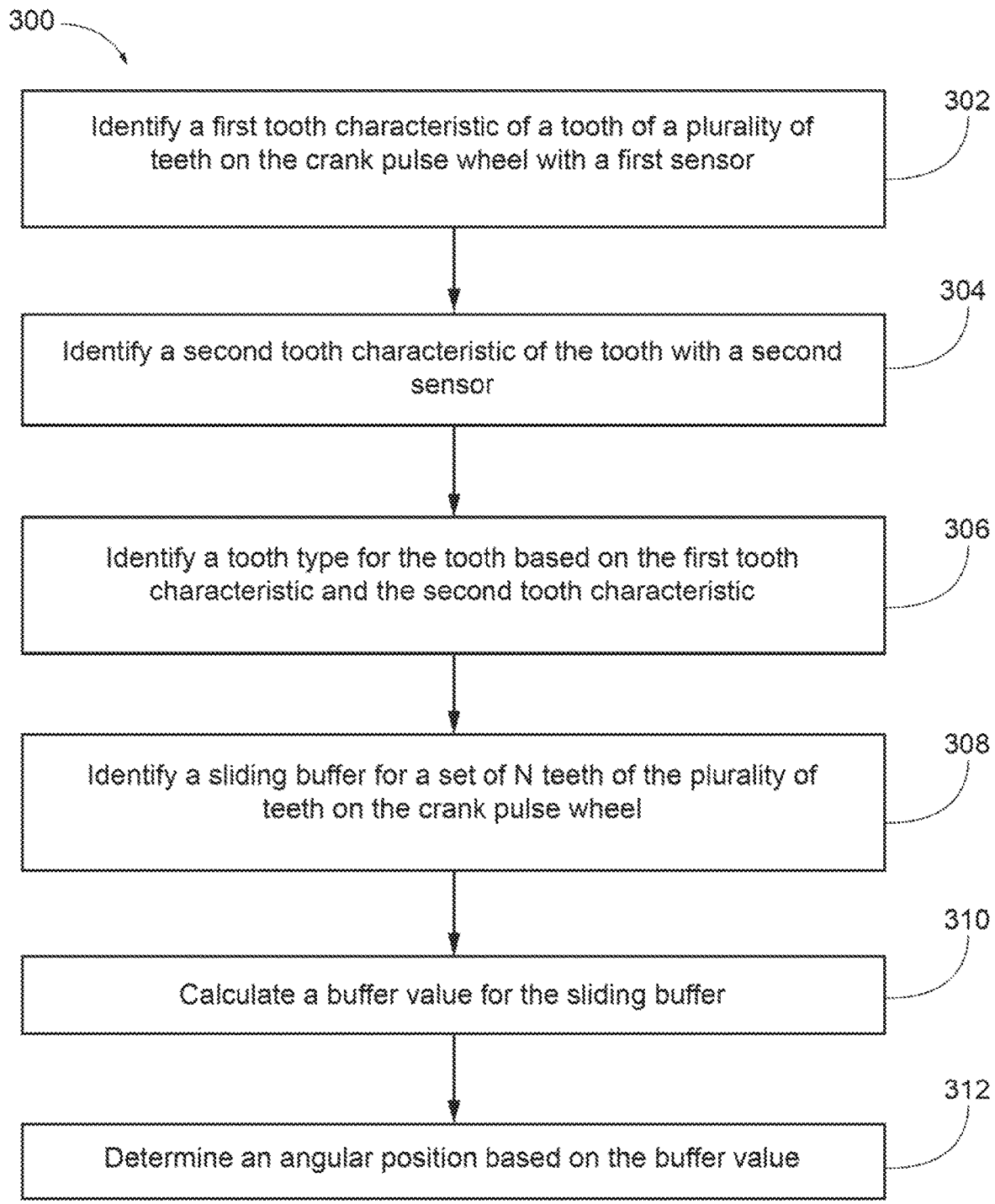
FIG. 3 is an example flow diagram of a method for crankshaft tooth sensing according to one or more embodiments.
Figure 4:
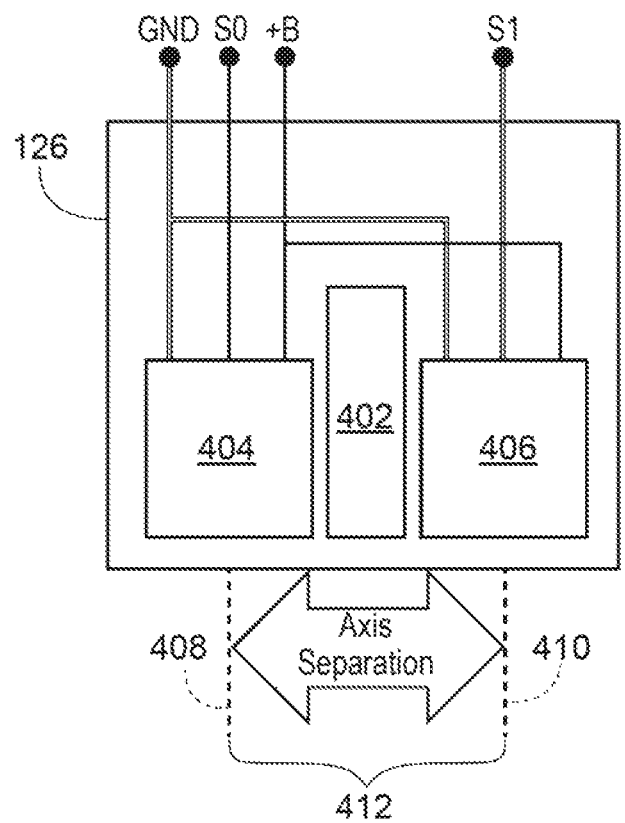
FIG. 4 is a schematic diagram of crankshaft sensor according to one or more embodiments.

Referring now to FIG. 3, a method 300 for crankshaft tooth sensing will now be described according to an exemplary embodiment. FIG. 3 will be described with reference to FIGS. 1, 2, and 4-12. As shown in FIG. 3, the method for providing a crankshaft tooth sensing is described according to a number of steps for simplicity, but it is understood that the elements of the method 300 can be organized into different architectures, blocks, stages, and/or processes.

At block 302, the method 300 includes the read module 114 identifying a first tooth characteristic of a tooth of a plurality of teeth on the crank pulse wheel 202 with a crankshaft sensor 126 having a magnetic element 402, a first sensor element 404, and a second sensor element 406. The magnetic element 402 generates a symmetric magnetic field. The magnetic element 402 may be a single magnet that prevents interference of magnetic fields from multiple magnets. In some embodiments, the magnetic element 402 may be a rare earth magnet comprised of alloys or rare-earth elements. The first sensor element 404 and the second sensor element 406 may the same or different types of sensor. One type of sensor of the first sensor element 404 and/or the second sensor element 406 may be a sensor that measures the magnitude of the magnetic field generated by the magnetic element 402. For example, the first sensor element 404 and/or the second sensor element 406 may be a Hall effect sensor, giant magneto-resistive sensor, variable reluctance sensor, or magneto-resistance probe, among others that measures variations in the magnetic field. In some embodiments, the magnetic element 402 is interposed between and separates the first sensor element 404 and the second sensor element 406. The symmetric location of the first sensor element 404 and the second sensor element 406 allows for shared use of the magnetic element 402.

The magnetic element 402 generates a magnetic field that encompasses at least a portion of the crank pulse wheel 202. The magnetic element 402 may also generate a magnetic field that does not encompass a portion of the crank pulse wheel but is sufficiently proximate the crank pulse wheel 202 such the first sensor element 404 and/or the second sensor element 406 can measure variations in the magnetic field caused by the presence of the crank pulse wheel 202. As discussed above, the crank pulse wheel 202 has a plurality of teeth. In some embodiments, the plurality of teeth may be arranged in a single track on the crank pulse wheel 202. The first sensor element 404 and/or the second sensor element 406 may measure variations in the magnetic field along different axes. For example, the first sensor element 404 may measure variations in the magnetic field along a first axis 408 and the second sensor element 406 may measure variations in the magnetic field along a second axis 410. In some embodiments, the first axis 408 is parallel to the second axis 410. In other embodiments, the first axis 408 may be angled relative to the second axis 410. For example, the first axis 408 may be perpendicular to the second axis 410.

The first tooth characteristic is determined based on the output of the first sensor element 404. Tooth characteristics are physical features of at least some of the teeth on the crank pulse wheel 202 that make the teeth differentiable by the crankshaft sensor 126. A tooth characteristic may be based on geometric properties of a tooth and include the size and/or shape of the teeth on the crank pulse wheel 202 or physical geometric features of the crank pulse wheel 202 itself. For example, the tooth geometry may include height, irregular formations (e.g., outcroppings, protrusions, nodules, etc.), thickness, depth, surface angle, surface patterning, voids, holes, cavities, and/or guides, among others. The tooth characteristics may also include material-based differences, differences in radiation profiles of the teeth, spectral differences on the electromagnetic spectrum, and/or optical differences (e.g., color), among others that can be sensed by the vehicle sensors 124.

Figure 5:
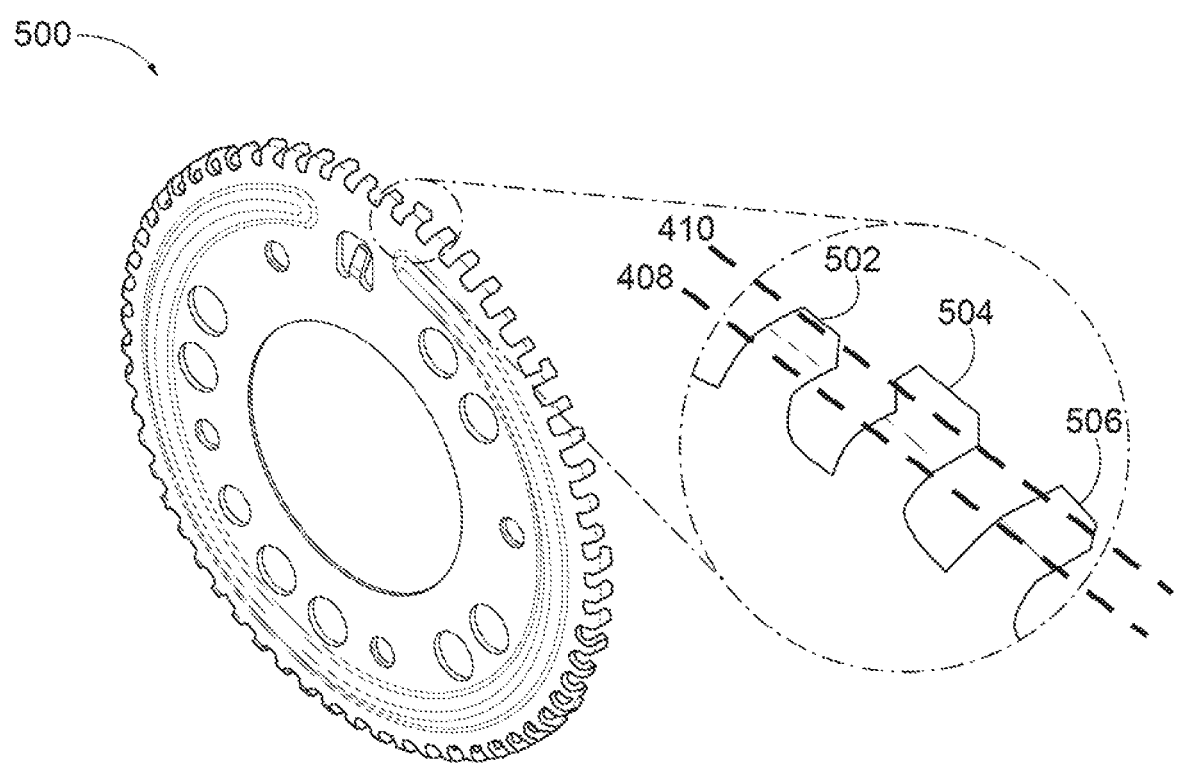
FIG. 5 is a schematic diagram of crankshaft tooth geometry of a crank pulse wheel according to one or more embodiments.

In one embodiment, the first tooth characteristic may be determined in variations to the magnetic field measured along the first axis 408. The first tooth characteristic may be the presence and/or the tooth length of a tooth. Turning to FIG. 5 an example diagram of crankshaft tooth geometry of a crank pulse wheel 500 is shown having a first tooth 502, a second tooth 504, and a third tooth 506. In one embodiment, the first tooth characteristic may be the presence of a tooth on the crank pulse wheel 202. For example, the first sensor element 404 may measure variations in the magnetic field associated with the presence of a tooth. The read module 114 may then determine the first characteristic as a tooth being present or a gap being present at that position on the crank pulse wheel 202.

In another embodiment, the read module 114 may identify the first tooth characteristic as a geometric aspect of a present tooth. For example, the first tooth characteristic may be a tooth having a threshold length. Here, the first tooth 502 and the third tooth 506 may have sufficient length to cause a threshold variation in the magnetic field at the first axis. Accordingly, the read module 114 may identify the first tooth 502 and the third tooth 506 as being long teeth while the second tooth 504 is identified as a short tooth.

At block 304 the method 300 includes the read module 114 identifying a second tooth characteristic of a tooth with the second sensor element 406. As discussed above, in some embodiments, the second sensor element 406 may measure variations in the magnetic field at the second axis 410. The measured variance in the magnetic field for the first tooth characteristic and the second tooth characteristic may be based on the axis separation 412 between the first axis 408 and the second axis 410.

The second tooth characteristic may be protrusion width that is normal to a radially outward direction of the crank pulse wheel 202. The protrusion width may be a measure of how far a protrusion or outcropping extends away from the base of the tooth. Turning to FIG. 5, the second tooth 504 and the third tooth 506 have protrusions that extend over to the line demarcating the second axis 410 while the first tooth 502 does not. Thus, the second tooth 504 and the third tooth 506 may cause variations in the magnetic field that can be detected by the second sensor element 406 measuring along the second axis 410. Accordingly, the read module 114 may identify the second tooth 504 and the third tooth 506 as being angled teeth while the first tooth 502 is identified as extending in a radially outward direction of the crank pulse wheel 500 without an outcropping also referred to as a normal tooth.

In another embodiment, the second sensor element 406 may be a color sensor. The color sensor may emit a light on the tooth, such as the first tooth 502, the second tooth 504, and the third tooth 506. The color sensor detects a color of the face (e.g., at least one surface) of the tooth. The color sensor may emit white light onto the tooth and determining the reflected color. The reflected color may be in the RGB scale. Accordingly, the second characteristic may be a color of at least one face of the tooth. Suppose that the first tooth 502 is red, the second tooth 504 is green, and the third tooth 506 is blue. The read module 114 then identifies the second tooth characteristic of the first tooth 502 as red, the second tooth 504 is green, and the third tooth 506 is blue with the second sensor element 406.

Returning to FIG. 3, at block 306 the method 300 includes the read module 114 a identifying a tooth type for a tooth based on, at least, the first tooth characteristic and the second tooth characteristic. The tooth type may be based on the number of possible combinations of the different tooth characteristics. Continuing the example from above, suppose the first tooth characteristic is presence and the second tooth characteristic is color. When the first sensor element 404 detects a present tooth, the second sensor element 406 may detect the color of the present tooth. For example, again suppose that the first tooth 502 is red, the second tooth 504 is green, and the third tooth 506 is blue. The read module 114 may identify the tooth type for the present teeth based on the color. Therefore, the tooth type for the first tooth 502 may be present-red, the tooth type for the second tooth 504 as present-green, and the tooth type for the third tooth 506 as present-blue. The read module 114 may also identify gaps between the teeth of the crank pulse wheel. In one embodiment the teeth on the crank pulse wheel may not be evenly spaced. Accordingly, a tooth characteristic may be the length of a gap between teeth.

In another embodiment, both the first tooth characteristic and the second tooth characteristic can be variable. For example, the first tooth characteristic can be either "long" or "short" and the second tooth characteristic can be either "normal" or "angled." Accordingly, the different possible combinations include long-normal, long-angled, short-normal, or short-angled. In the table below, the combinations of the first tooth characteristic and the second tooth characteristic is given for the first tooth 502, the second tooth 504, and the third tooth 506. The different combinations can be associated with different characteristic values. For example, the characteristic values may include long-normal as (1), long-angled as (2), short-normal as (3), or short-angled as (4). Therefore, the first tooth 502 has a characteristic value of 1, the second tooth 504 has a characteristic value of 4, and the third tooth 506 has a characteristic value of 2.

|  | First Tooth 502 | Second Tooth 504 | Third Tooth 506 |
|---|---|---|---|
| First Tooth Characteristic | Long | Short | Long |
| Second Tooth Characteristic | Normal | Angled | Angled |
| Characteristic Value | 1 | 4 | 2 |

Figure 6:
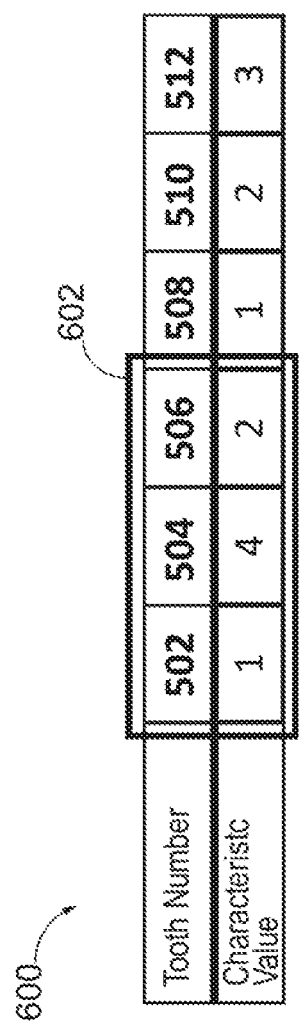
FIG. 6 is a crank tooth table with a second sliding buffer according to one or more embodiments.

At block 308, the method 300 includes the buffer module 116 identifying a sliding buffer for a set of N teeth of the plurality of teeth on the crank pulse wheel 202. N is a positive integer less than a total number of teeth of the crank pulse wheel 202. Turning to FIG. 6 is a crank tooth table 600 that includes crank tooth reference numbers corresponding to the characteristic values described above. The crank tooth table 600 has a first sliding buffer 602. The sliding buffer can be incremented by one tooth, such that the read module 114 can begin anywhere on the crank pulse wheel 202. For example, turning to FIG. 6, is a crank tooth table 600 with a first sliding buffer 602.

Here, the first sliding buffer 602 includes the first tooth 502 with a tooth type (1), the second tooth 504 with a tooth type (4), and the third tooth 506 with a tooth type (2). Accordingly, the first sliding buffer 602 has N equal to three such that the first sliding buffer includes the characteristic value for three consecutive teeth. As discussed above, the sliding buffer can be incremented by one tooth, such that the read module 114 can begin anywhere on the crank pulse wheel 202. For example, a second sliding buffer may include the second tooth 504 with a tooth type (4) and the third tooth 506 with a tooth type (2) with the tooth type (1) of a fourth tooth 508. Likewise, a third sliding buffer incremented one tooth from the second sliding buffer would include the third tooth 506 with a tooth type (2), the fourth tooth 508 with tooth type (1), and a fifth tooth 510 with a tooth type (2). The read module 114 may only need to read the next tooth to identify the sliding buffer. For example, to read the fourth sliding buffer, the read module may only read a sixth tooth 512 with tooth type (3), since the fourth tooth 508 and the fifth tooth 510 were previously sensed.

At block 310, the method 300 includes the buffer module 116 calculating a buffer value for the sliding buffer corresponding to the N set of teeth represented in the sliding buffer. A buffer value is calculated for the sliding buffer corresponding to a tooth represented in the sliding buffer. The buffer module 116 may calculate the buffer value using different sensing types associated with numerical systems such as arrays, decimals, hexadecimals, binary, trinary, and transformations, among others. In some embodiments, the buffer value may be arbitrarily assigned and indexed in a crank tooth map. The buffer value may include a single parameter or multiple parameters. For example, the first sliding buffer 602 may have a first buffer value that is an array (1, 4, 2) corresponding to the characteristic values for each of the teeth in the first sliding buffer 602, as shown in FIG. 6. Alternatively, the first buffer value may use the (1, 4, 2) as the decimal value 142, the hexadecimal value 8E, or the binary value 10001110 to conserve memory during operations.

At block 312, the method 300 includes the position module 118 determining an angular position of the crank pulse wheel 202 based on the buffer value. The positioning processes described below are performed by, coordinated by, and/or facilitated by the position module 118. The position module 118 may compare the buffer values to a listing of known angular positions. In particular, the angular position may correspond to a tooth included in the sliding buffer. For example, the first buffer value (1, 4, 2) may be compared to a crank tooth map.

The crank tooth map is a data look up table that can be accessed by the position module 118 to determine the crankshaft position based on the buffer value of a sliding buffer. The crank tooth map may be stored locally on the VCD 102 or remotely, such as at the manufacturer database 130 and accessed over the network 128. In one embodiment, the crank tooth map includes a tooth number row, a sliding buffer row, and an angular position row. In another embodiment, rather than an angle for the angular position, the crank tooth map may include an indexed numerical value to indicate the position of the crank pulse wheel 202. Continuing the example, from above, the position module 118 may then determine that the buffer value (1, 4, 2) corresponds to the angular position of 330°. In this manner the position module determines the angular position of the crank pulse wheel 202.

Because each angular position on the crank pulse wheel 202 corresponds to a specific buffer value, the buffer values do not repeat. Therefore, the read module 114 only needs to identify the tooth type for as many teeth on the crank pulse wheel 202 as are in the sliding buffer in order for the position module 118 to determine a position on the crank pulse wheel 202. For example, suppose that the buffer module 116 calculates the first buffer as (1, 4, 2), the second buffer value as (4, 2, 1), and the third buffer value as (2, 1, 2). The position module 118 may determine that the second buffer value corresponds to an angular position of 0° on the crank pulse wheel 202. Because the first buffer value (1, 4, 2) is different than the second buffer value (4, 2, 1), the position module 118 can distinguish between the angular positions indicated by the first sliding buffer 602 and the second sliding buffer.

Figure 7:
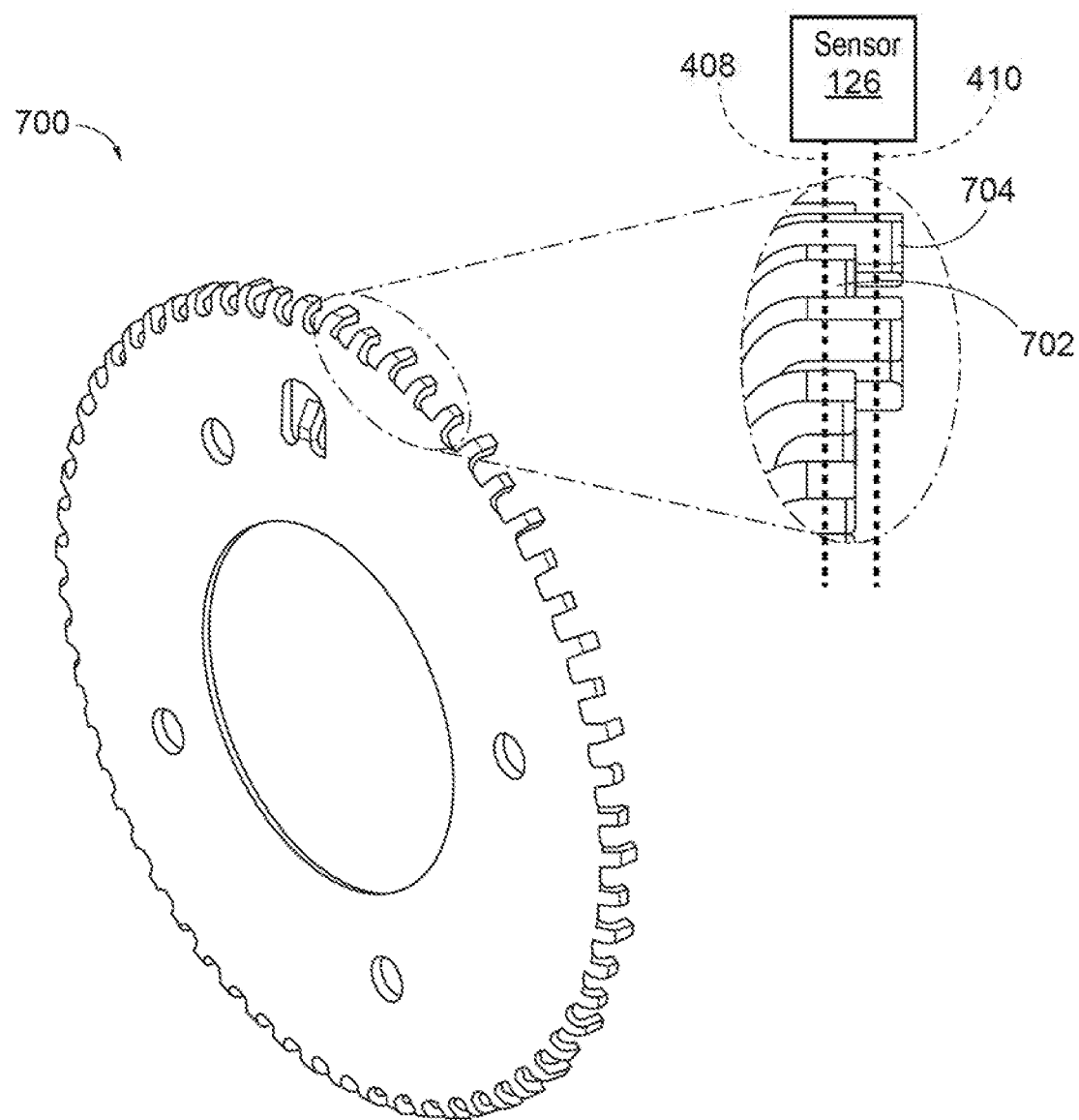
FIG. 7 is a schematic diagram of crankshaft tooth geometry of a crank pulse wheel according to one or more embodiments.

FIG. 7 is a schematic diagram of crankshaft tooth geometry of a crank pulse wheel 700 according to one or more embodiments. Here, the first tooth characteristic is a tooth having a first length and the second tooth characteristic is the tooth having a second length. The extension direction of the length may be based on the position of the first sensor element 404 and the second sensor element 406. For example, the teeth of the crank pulse wheel 700 are arranged in a single track and have a first portion that extends in a radial direction from the crank pulse wheel 700 and a second portion that extends in a longitudinal direction from the crank pulse wheel 700. The second portion of the teeth may extend in a first longitudinal direction such that each of teeth has a second portion that extends in the first longitudinal direction. The first portion is separated from the second portion by a bend in the tooth.

The varying tooth length may be measured based on the first portion or the second portion. Here, suppose that the first tooth characteristic and the second tooth characteristic may be based on varying lengths of the second portion extending in the first longitudinal direction. Based on the placement of the first sensor element 404, the first sensor element 404 may sense along the first axis 408 that correspond to a first longitudinal length, and the second sensor element 406 may sense along the second axis 410 which corresponds to a second longitudinal length.

Because the teeth of the crank pulse wheel 700 are comprised of a magnetic material, a tooth having a second portion extending in longitudinal direction that crosses the first axis 408 and/or the second axis 410 would be sensed by the corresponding sensor element, the first sensor element 404 and/or the second sensor element 406, respectively. For example, tooth 702 has a second portion that extends in the first longitudinal direction to a first length that intersects the first axis 408 but not the second axis 410. Accordingly, the first sensor element 404 would detect the tooth 702, but the second sensor element 406 would not such that the first tooth characteristic is "present" and the second tooth characteristic is "not present."

Triggering the first sensor element 404 but not the second sensor element 406, may cause the read module 114 to identify a tooth type for the tooth 702 as "short" because the tooth was sensed for the first sensor element 404 but not the second sensor element 406. In this manner, the first characteristic may be that the tooth is sensed as "present" by one sensor element but not sensed as "present" by another sensor element. The tooth 704 traverses both the first axis 408 and the second axis 410. Therefore both the first sensor element 404 and the second sensor element 406 would sense the tooth 704 as present such that the first tooth characteristic is "present" and the second tooth characteristic is "present" based on the second portion of tooth 704 extending in the first longitudinal direction to a second length. Thus, the read module 114 may identify a tooth type for the tooth 704 as "long."

Figure 8:
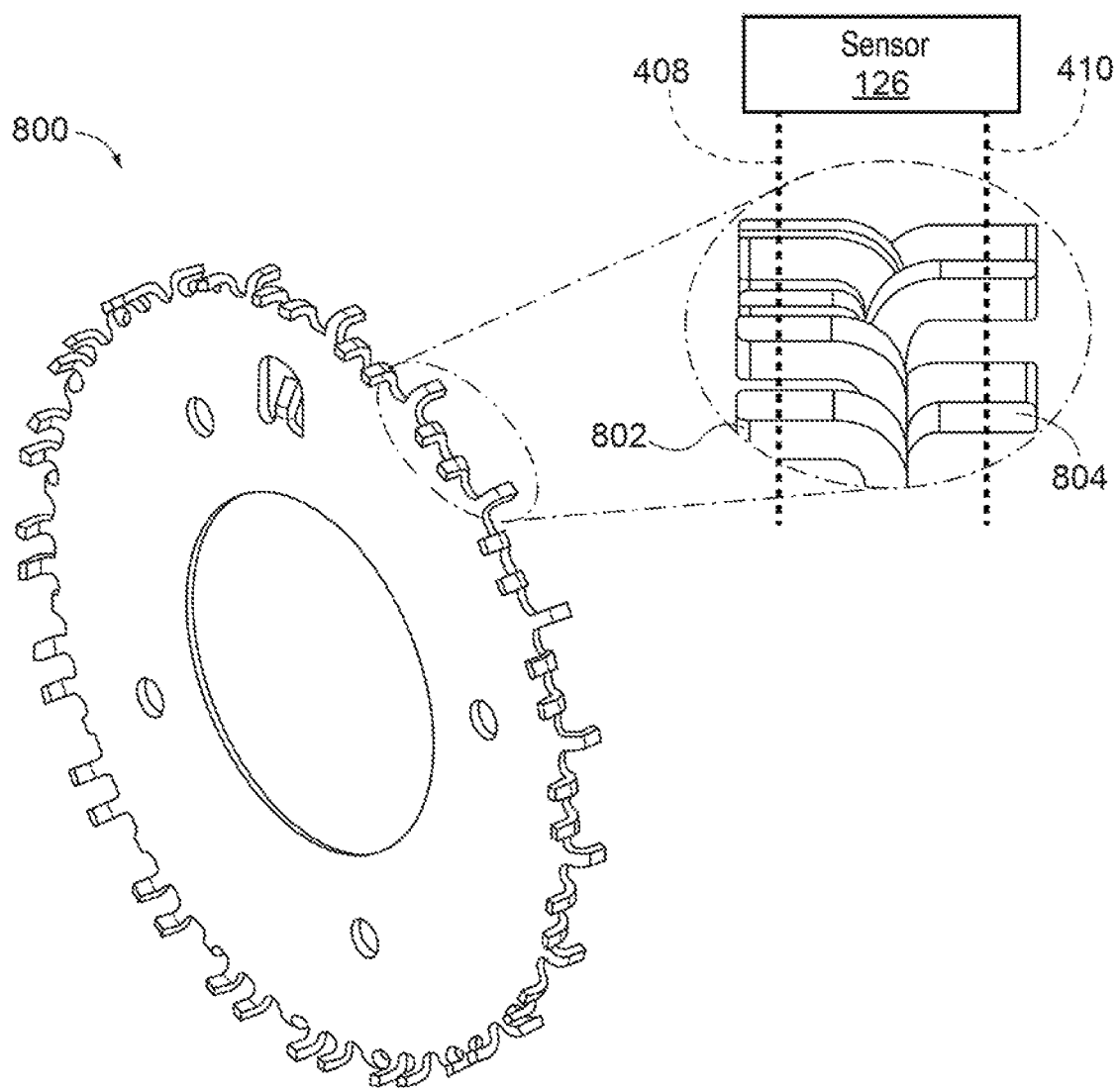
FIG. 8 is a schematic diagram of crankshaft tooth geometry of a crank pulse wheel according to one or more embodiments.

FIG. 8 is a schematic diagram of crankshaft tooth geometry of a crank pulse wheel 800 in which the first tooth characteristic and the second tooth characteristic are based on lengths of the second portion extending either the first longitudinal direction or a second longitudinal direction opposite the first longitudinal direction. In the example of crank pulse wheel 700 of FIG. 7, a tooth having a second portion extending in a longitudinal direction would be sensed by the first sensor element 404. The tooth in crank pulse wheel 800 of FIG. 8 may be sensed by the first sensor element 404 depending on the longitudinal direction that the second portion of the tooth extends in. Like the teeth of the crank pulse wheel 700, the teeth of the crank pulse wheel 800 have a first portion that extends in a radial direction from the crank pulse wheel 700 and a second portion that extends in a longitudinal direction from the crank pulse wheel 800. However, here, the second portion of the teeth may extend in the first longitudinal direction or in the second longitudinal direction.

The crankshaft sensor 126 may sense gap and the characteristics of the teeth of the crank pulse wheel 800 in the manner described above. For example, a gap between the teeth may be sensed as a gap based on the first sensor element 404 and the second sensor element 406 registering as "not present." A tooth may be detected on the crank pulse wheel 800 depending on whether the second portion extends in the first longitudinal direction or the second longitudinal direction. For example, the tooth 802 extends in a first longitudinal direction and intersects the first axis 408 such that the tooth 802 is sensed by the first sensor element 404.

The tooth 804 extends in a second longitudinal direction and intersects the second axis 410 such that the tooth 804 is sensed by the second sensor element 406. Therefore, in this embodiment, when a tooth is sensed, it is sensed by either the first sensor element 404 or the second sensor element 406. While the first longitudinal direction is shown opposite the second longitudinal direction, the first longitudinal direction and the second longitudinal direction may form various angles depending on the position of the first sensor element 404 relative to the second sensor element 406.

Figure 9:
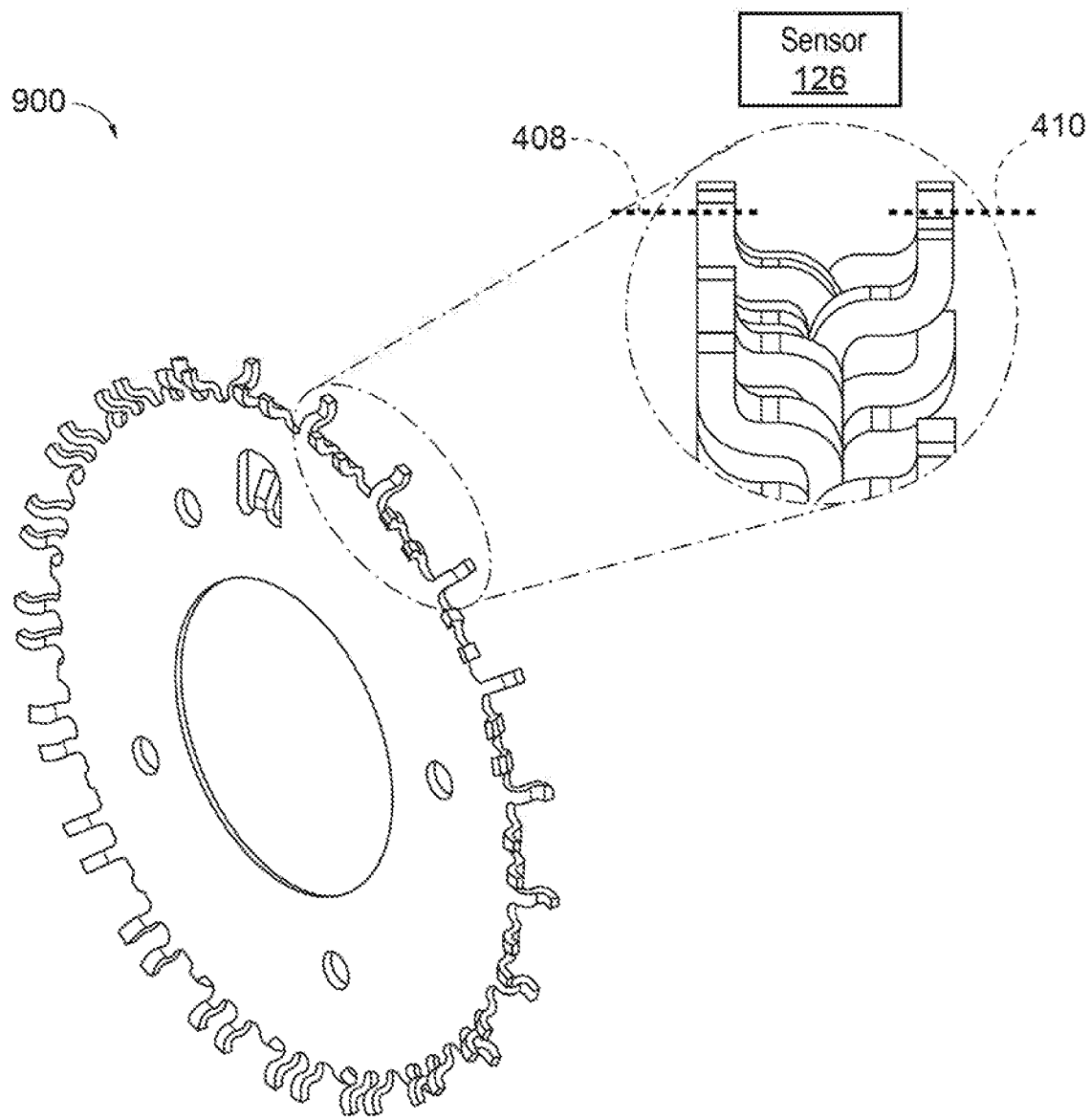
FIG. 9 is a schematic diagram of crankshaft tooth geometry of a crank pulse wheel according to one or more embodiments.

FIG. 9 is a schematic diagram of crankshaft tooth geometry of a crank pulse wheel 900 according to one or more embodiments. In previously described embodiments, for example, the first axis 408 and the second axis 410, shown if FIG. 7 and FIG. 8, extend in a radial direction of the crank pulse wheel. Here, the first axis 408 and the second axis 410 extend in the longitudinal directions relative to the crank pulse wheel 900.

The teeth of the crank pulse wheel 900 are arranged in a single track on the crank pulse wheel 900 and have a first portion that extends in a radial direction from the crank pulse wheel 900, a second portion that extends in a longitudinal direction from the crank pulse wheel 900, and a third portion that extends in a radial direction from the crank pulse wheel 900. The second portion of the teeth may extend in a first longitudinal direction or a second longitudinal direction. The first section is separated from the second section by a first bend in the tooth and the second section is separated from the third second by a second bend in the tooth.

Whereas the varying tooth length in the embodiments shown in FIG. 7 and FIG. 8 was based on the second portion extending in the longitudinal direction, here, the varying tooth lengths may be based on the first portion and/or the third portion extending in the radial directions. For example, the first sensor element 404 may sense along the first axis 408 corresponding to a first radial length, and the second sensor element 406 may sense along the second axis 410 corresponding to a second radial length. Additionally or alternatively, a tooth may be detected on the crank pulse wheel 900 depending on whether the second portion extends in the first longitudinal direction or the second longitudinal direction.

In one embodiment, triggering the first sensor element 404 but not the second sensor element 406, may cause the read module 114 to identify a tooth type for the tooth 702 as "short" because the tooth was sensed for the first sensor element 404 but not the second sensor element 406. In this manner, the first characteristic may be that the tooth is sensed as "present" by one sensor element but not sensed as "present" by another sensor element. The tooth 704 traverses both the first axis 408 and the second axis 410. Therefore both the first sensor element 404 and the second sensor element 406 would sense the tooth 704 as present such that the first tooth characteristic is "present" and the second tooth characteristic is "present" based on the second portion of tooth 704 extending in the first longitudinal direction to a second length. Thus, the read module 114 may identify a tooth type for the tooth 704 as "long."

Figure 10:
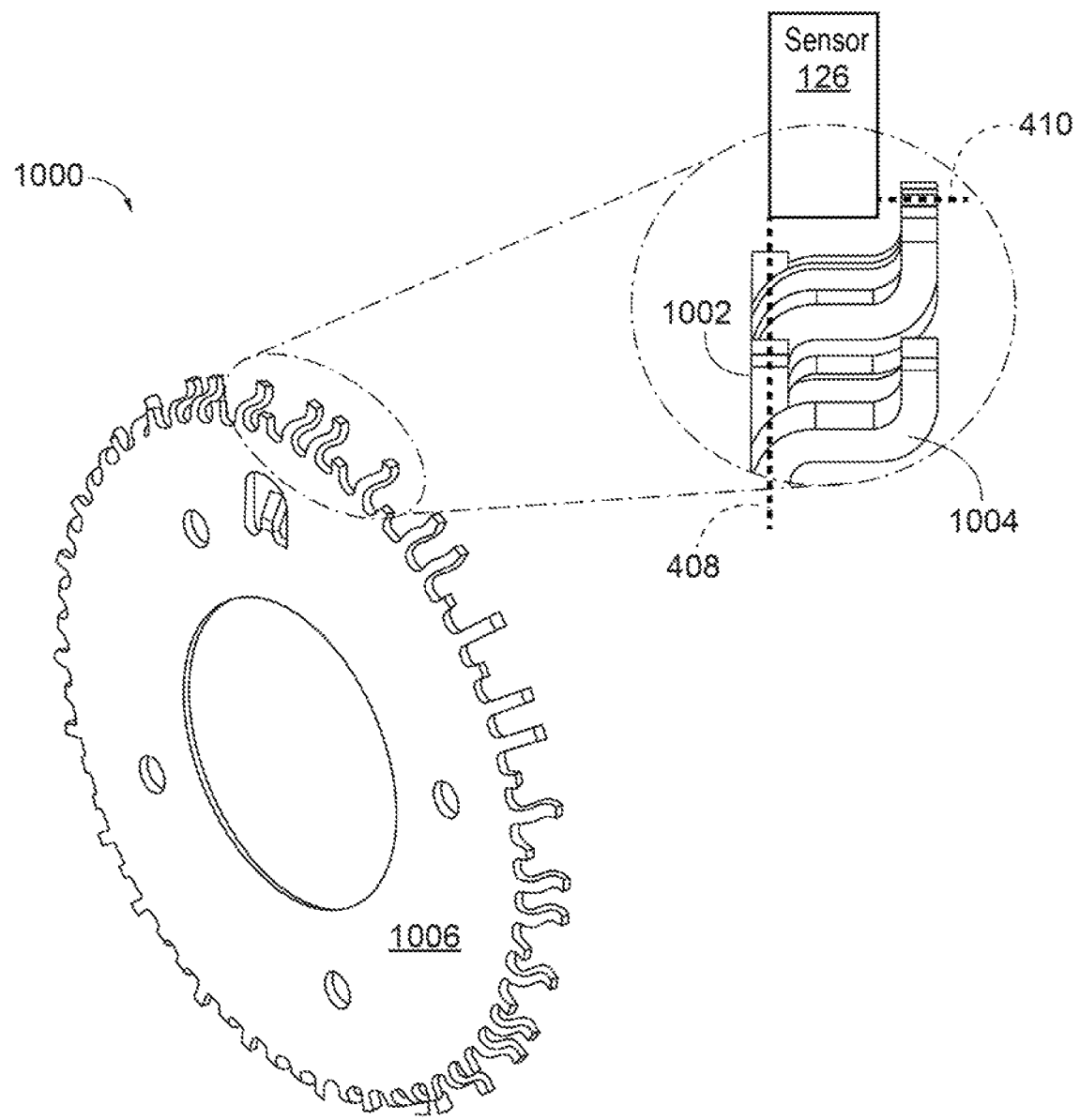
FIG. 10 is a schematic diagram of crankshaft tooth geometry of a crank pulse wheel according to one or more embodiments.

FIG. 10 is a schematic diagram of crankshaft tooth geometry of a crank pulse wheel 1000 according to one or more embodiments. Various tooth geometries have been described for teeth arranged in a single track on the crank pulse wheel. For example, FIG. 7 and FIG. 8 illustrate teeth having a first portion extending in a radial direction and a second portion extending in a longitudinal direction that are separated by a bend. FIG. 9 illustrates a teeth having a first portion extending in a radial direction, a second portion extending in a longitudinal direction, and a third portion extending in the radial direction in which the portions are separated by bends. Other teeth may only have a radial portion that extends upward from the crank pulse wheel. The various geometries may be used together on a crank pulse wheel. For example, the crank pulse wheel 1000 may include tooth 1002 that has a single portion that extends in a radial direction and tooth 1004 that has a first portion extending in a radial direction, a second portion extending in a longitudinal direction, and a third portion extending in a radial direction in which the portions are separated by bends.

The crankshaft sensor 126 may sense teeth at different radial and longitudinal lengths. For example, suppose that a face 1006 of the crank pulse wheel 1000 defines a first plane and the first portion of a tooth is the radial portion extending in the radial direction in the first plane. The first sensor element 404 may sense along the first axis 408 such that any tooth having a radial portion the first plane is sensed. Therefore both the tooth 1002 and the tooth 1004 are sensed by the first sensor element 404 as present.

The second sensor element 406 may define second axis 410 in order to sense a tooth in a second plane. The second plane may be parallel to the first plane offset by a longitudinal distance. In some embodiments, the longitudinal distance may correspond to the longitudinal length of the second portion of tooth 1004. The tooth 1004 has a second portion that extends in the first longitudinal direction to a longitudinal length that intersects the second plane, and thus the second axis 410. Accordingly, the first sensor element 404 would detect the first radial portion of the tooth 1004, and the second sensor element 406 would detect the tooth 1004 based on the second portion, the second bend, and/or the third portion.

In previous embodiments, the first axis 408 and the second axis 410 have been shown to be generally parallel. However, the first axis 408 and the second axis 410 may form various angles depending on the position of the first sensor element 404 relative to the second sensor element 406. For example, in FIG. 10 the first axis 408 may be perpendicular relative to the second axis 410. The first axis 408 may be aligned with the first plane such that the first axis 408 is radially in line with the face 1006 of the crank pulse wheel 1000. The second axis 410 may extend longitudinally from the face 1006 of the crank pulse wheel 1000. Accordingly, the crankshaft sensor may be able to sense various geometries of teeth arranged in a single track on the crank pulse wheel 1000 along different planes and axes.

Figure 11:
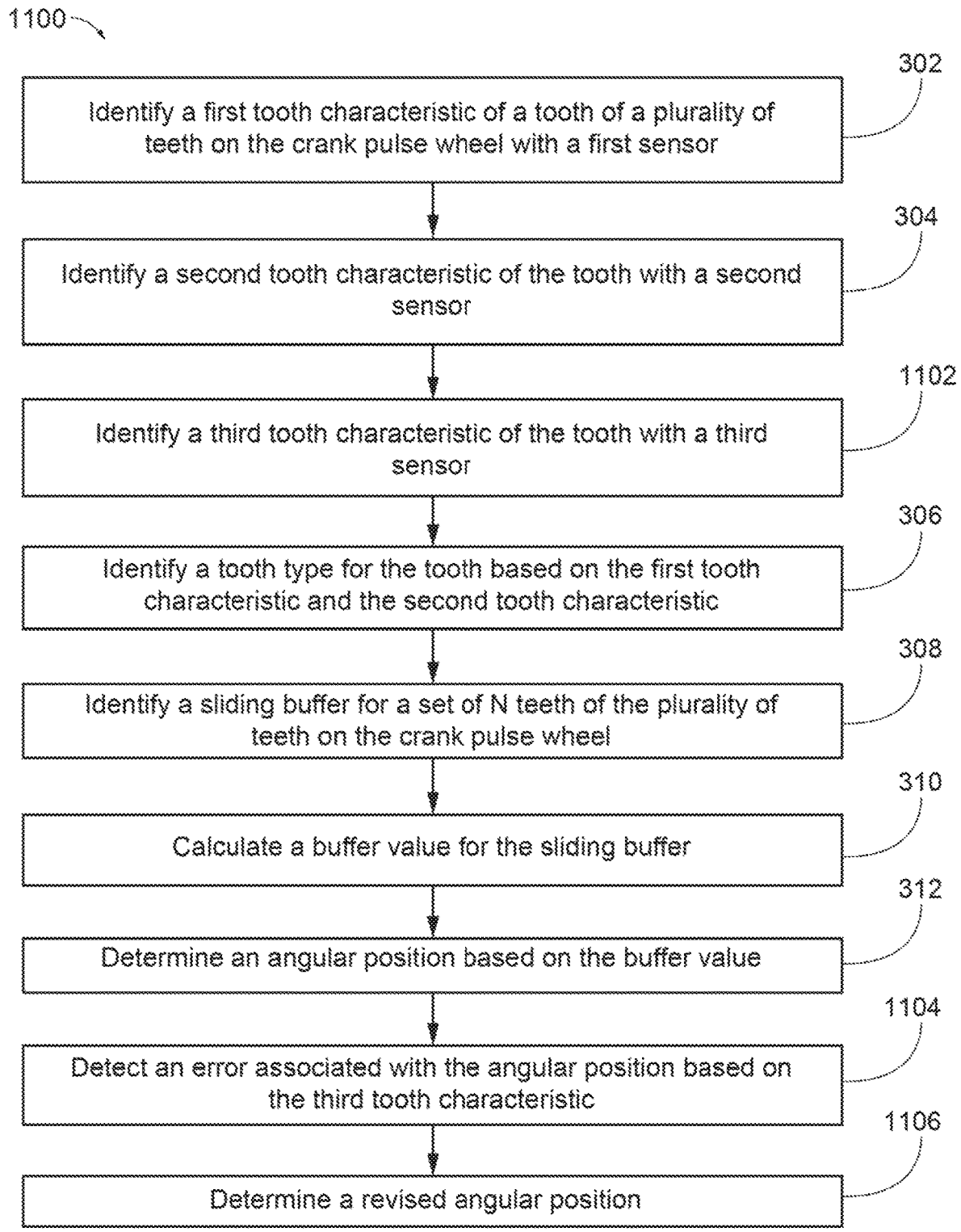
FIG. 11 is an example flow diagram of another method for crankshaft tooth sensing according to one or more embodiments.

FIG. 11 is an example flow diagram of another method for crankshaft tooth sensing according to one or more embodiments. FIG. 11 will be described with reference to FIGS. 1-6 and 8. As shown in FIG. 11, another method for providing a crankshaft tooth sensing is described according to a number of steps for simplicity, but it is understood that the elements of the method 1100 can be organized into different architectures, blocks, stages, and/or processes. Some of the steps operate in a similar manner as described with respect to method 300 of FIG. 3.

At block 302, the method 1100 includes the read module 114 identifying a first tooth characteristic of a tooth of a plurality of teeth on the crank pulse wheel 202 with a first sensor element 404. In one embodiment, the first tooth characteristic is a variation in the magnetic field along the first axis 408. The first sensor element 404 may be a giant magnetoresistance sensor.

At block 304, the method 1100 includes the read module 114 identifying a second tooth characteristic of the tooth with a second sensor element 406. In one embodiment, the second tooth characteristic is a variation in the magnetic field along the second axis 410 parallel to and separated from the first axis 408 by an axis separation 412. The second sensor element 406 may also be a giant magnetoresistance sensor. The first sensor element 404 and the second sensor element 406 may be separated by the magnetic element 402.

Figure 12:
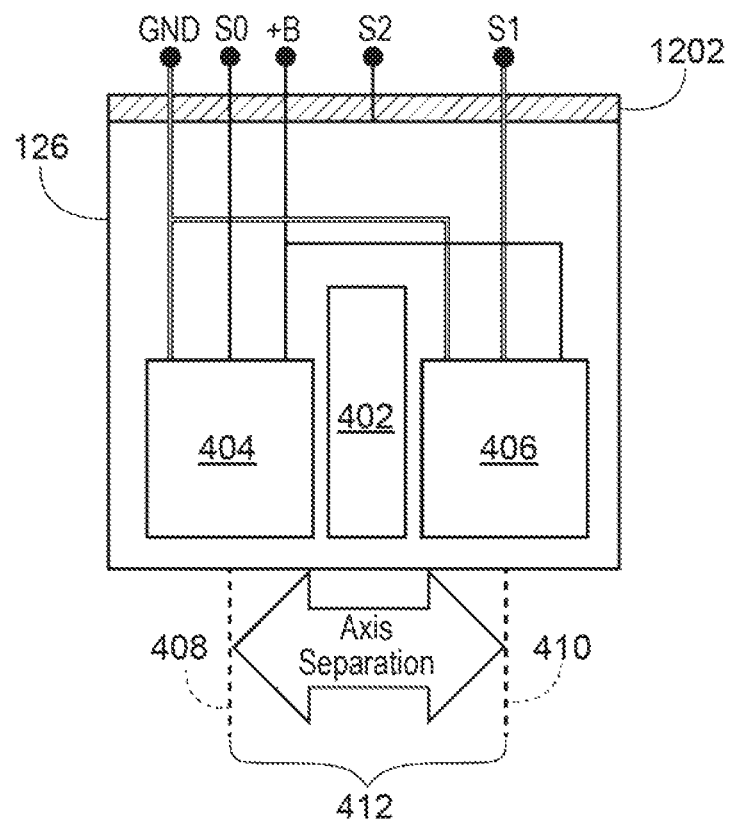
FIG. 12 is another schematic diagram of crankshaft sensor according to one or more embodiments.

At block 1102 the method 1100 includes the read module 114 identifying a third tooth characteristic of the tooth with a third sensor 1202 as shown in FIG. 12. Suppose that the first sensor element 404 and the second sensor element 406 are both giant magnetoresistance sensors, the third sensor 1202 may be a color sensor.

At block 306, the method 1100 includes the read module 114 identifying a tooth type for the tooth based on the first tooth characteristic and the second tooth characteristic. For example, the tooth type may be based on variations in the magnetic field at the first axis 408 and the second axis 410. In another embodiment, the read module 114 may identify the tooth type based on the first tooth characteristic, the second tooth characteristic, and the third tooth characteristic. For example, the tooth type may be based on variations in the magnetic field at the first axis 408 and the second axis 410 as well as a color of at least one face of the tooth.

At block 308, the method 1100 includes the buffer module 116 identifying a sliding buffer for a set of N teeth of the plurality of teeth on the crank pulse wheel 202. At block 310, the method 1100 includes the buffer module 116 calculating a buffer value for the sliding buffer corresponding to the N set of teeth represented in the sliding buffer. At block 312, the method 1100 includes the position module 118 determining an angular position of the crank pulse wheel based on the buffer value.

At block 1104, the method 1100 includes the position module 118 detecting an error associated with the angular position based on the third tooth characteristic. For example, suppose that the read module 114 identified the tooth type of the first tooth 502 based on the first tooth characteristic, the measured variations in the magnetic field at the first axis 408, and the second tooth characteristic, the measured variations in the magnetic field at the second axis 410. Based on the first tooth characteristic and the second tooth characteristic, the read module 114 may identify the tooth type of the first tooth 502 as an angled tooth. Suppose that angled teeth are colored blue or green, but that the third tooth characteristic is that the first tooth is red. Because the tooth type based on the first tooth characteristic and the second characteristic does not comport with the third characteristic, the position module 118 may detect that an error has occurred. Because there has been an error, the angular position determined at block 312 is suspected to be incorrect.

At block 1106, the method 1100 includes the position module 118 determining a revised angular position due to the error. For example, if the tooth type was previously based on two tooth characteristic, the method 1100 may perform a next iteration for the teeth in the next sliding buffer in which the tooth types are determined based on more characteristics. In another embodiment, the revised angular position may be determined based on different tooth characteristics. For example, the revised angular position of the crank pulse wheel 202 may be based on the first tooth characteristic and the third tooth characteristic. Accordingly, the tooth type of the teeth in the crank pulse wheel 202 can be determined based on more or different data in order to revise the tooth types and thus the calculated angular position. Because each tooth of the plurality of teeth is associated with a corresponding buffer value, and the buffer values are unique, the angular position is revised accordingly.

By combining two or more of the tooth characteristics, the systems and methods described herein receive more information (e.g. tooth characteristics) about a single tooth on the first crank pulse wheel 202. Accordingly, the system may only have to read two teeth to determine the angular position of the crank pulse wheel 202. Furthermore, if an error is detected, the angular position previously determined can be revised based on the information received for that single tooth. Accordingly, the systems and methods herein provide more efficient determination of the angular position of the crank pulse wheel, but additionally offer more reliable angular positions. Moreover, the angular positions can be revised based on the information.

Various operations of embodiments are provided herein. The order in which one or more or all of the operations are described should not be construed as to imply that these operations are necessarily order dependent. Alternative ordering will be appreciated based on this description. Further, not all operations may necessarily be present in each embodiment provided herein.

As used in this application, "or" is intended to mean an inclusive "or" rather than an exclusive "or". Further, an inclusive "or" may include any combination thereof (e.g., A, B, or any combination thereof). In addition, "a" and "an" as used in this application are generally construed to mean "one or more" unless specified otherwise or clear from context to be directed to a singular form. Additionally, at least one of A and B and/or the like generally means A or B or both A and B. Further, to the extent that "includes", "having", "has", "with", or variants thereof are used in either the detailed description or the claims, such terms are intended to be inclusive in a manner similar to the term "comprising".

Further, unless specified otherwise, "first", "second", or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel. Additionally, "comprising", "comprises", "including", "includes", or the like generally means comprising or including, but not limited to.

It will be appreciated that various embodiments of the above-disclosed and other features and functions, or alternatives or varieties thereof, may be desirably combined into many other different systems or applications. Also, that various presently unforeseen or unanticipated alternatives, modifications, variations or improvements therein may be subsequently made by those skilled in the art which are also intended to be encompassed by the following claims.

The invention claimed is:

1. A method for crankshaft tooth sensing for a crank pulse wheel of a vehicle, the method comprising:
identifying a first tooth characteristic of a tooth of a plurality of teeth on the crank pulse wheel with a crankshaft sensor having a magnetic element, a first sensor element, and a second sensor element, wherein the plurality of teeth are arranged in a single track on the crank pulse wheel, and wherein the first tooth characteristic identified by the first sensor element sensing along a first axis of a magnetic field generated by the magnetic element;

identifying a second tooth characteristic of the tooth with the second sensor element sensing along a second axis of the magnetic field generated by the magnetic element;
identifying a tooth type for the tooth based on the first tooth characteristic and the second tooth characteristic
identifying a sliding buffer for a set of N teeth of the plurality of teeth on the crank pulse wheel, wherein N is a positive integer less than a total number of teeth of the crank pulse wheel;
calculating a buffer value for the sliding buffer corresponding to the N set of teeth represented in the sliding buffer; and
determining an angular position of the crank pulse wheel based on the buffer value.

2. The method for the crankshaft tooth sensing of claim 1, wherein the first tooth characteristic is presence of the tooth, and wherein the second tooth characteristic is based on a longitudinal length of the tooth in a longitudinal direction.

3. The method for the crankshaft tooth sensing of claim 1, wherein the first tooth characteristic is presence of the tooth, and wherein the second tooth characteristic is based on a radial length of the tooth in a radial direction.

4. The method for the crankshaft tooth sensing of claim 1, wherein the magnetic element is interposed between and separates the first sensor element and the second sensor element.

5. The method for the crankshaft tooth sensing of claim 1, wherein the first axis is perpendicular to the second axis.

6. The method for the crankshaft tooth sensing of claim 1, wherein the first axis is parallel to the second axis.

7. The method for the crankshaft tooth sensing of claim 1, wherein the first sensor element is a first magneto-resistive sensor and the second sensor element is a second magneto-resistive sensor.

8. The method for the crankshaft tooth sensing of claim 1, wherein the second sensor element is a color sensor and the second tooth characteristic is a color of at least one face of the tooth.

9. The method for the crankshaft tooth sensing of claim 1, further comprising:
identifying a third tooth characteristic with a third sensor;
detecting an error associated with the angular position of the crank pulse wheel based on the third tooth characteristic; and
determining a revised angular position of the crank pulse wheel based on the first tooth characteristic and the third tooth characteristic.

10. The method for the crankshaft tooth sensing of claim 1, wherein each tooth of the plurality of teeth is associated with a corresponding buffer value, and wherein buffer values are unique.

11. A non-transitory computer-readable storage medium storing instructions that, when executed by a computer, causes the computer to perform a method for crankshaft tooth sensing for a crank pulse wheel of a vehicle:
identifying a first tooth characteristic of a tooth of a plurality of teeth on the crank pulse wheel with a crankshaft sensor having a magnetic element, a first sensor element, and a second sensor element, wherein the plurality of teeth are arranged in a single track on the crank pulse wheel, and wherein the first tooth characteristic identified by the first sensor element sensing along a first axis of a magnetic field generated by the magnetic element;

identifying a second tooth characteristic of the tooth with the second sensor element sensing along a second axis of the magnetic field generated by the magnetic element;

identifying a tooth type for the tooth based on the first tooth characteristic and the second tooth characteristic identifying a sliding buffer for a set of N teeth of the plurality of teeth on the crank pulse wheel, wherein N is a positive integer less than a total number of teeth of the crank pulse wheel;

calculating a buffer value for the sliding buffer corresponding to the N set of teeth represented in the sliding buffer; and determining an angular position of the crank pulse wheel based on the buffer value.

12. The non-transitory computer-readable storage medium of claim 11, wherein the first tooth characteristic is presence of the tooth, and wherein the second tooth characteristic is based on a longitudinal length of the tooth in a longitudinal direction.

13. The non-transitory computer-readable storage medium of claim 11, wherein the first tooth characteristic is presence of the tooth, and wherein the second tooth characteristic is based on a radial length of the tooth in a radial direction.

14. The non-transitory computer-readable storage medium of claim 11, wherein the magnetic element is interposed between and separates the first sensor element and the second sensor element.

15. The non-transitory computer-readable storage medium of claim 11, wherein the first axis is parallel to the second axis.

16. A system for crankshaft tooth sensing for a crank pulse wheel of a vehicle, the system comprising:

a plurality of teeth on the crank pulse wheel arranged in a single track;

a crankshaft sensor having a magnetic element interposed between and separating a first sensor element and a second sensor element, wherein the first sensor element and the second sensor element are magnetic sensing devices;

a processor; and a memory storing instructions that are executed by the processor and cause the processor to:

identifying a first tooth characteristic of a tooth of the plurality of teeth on the crank pulse wheel with the first sensor element of the crankshaft sensor that senses along a first axis of a magnetic field generated by the magnetic element;

identifying a second tooth characteristic of the tooth of the plurality of teeth with the second sensor element senses along a second axis of the magnetic field generated by the magnetic element;

identifying a tooth type for the tooth based on the first tooth characteristic and the second tooth characteristic identifying a sliding buffer for a set of N teeth of the plurality of teeth on the crank pulse wheel, wherein N is a positive integer less than a total number of teeth of the crank pulse wheel;

calculating a buffer value for the sliding buffer corresponding to the N set of teeth represented in the sliding buffer; and determining an angular position of the crank pulse wheel based on the buffer value.

17. The system for the crankshaft tooth sensing of claim 16, wherein the first tooth characteristic is presence of the tooth, and wherein the second tooth characteristic is based on a longitudinal length of the tooth in a longitudinal direction.

18. The system for the crankshaft tooth sensing of claim 16, wherein the first tooth characteristic is presence of the tooth, and wherein the second tooth characteristic is based on a radial length of the tooth in a radial direction.

19. The system for the crankshaft tooth sensing of claim 16, wherein the first axis is parallel to the second axis.

20. The system for the crankshaft tooth sensing of claim 16, wherein the processor is further configured to:

identify a third tooth characteristic with a third sensor;

detect an error associated with the angular position of the crank pulse wheel based on the third tooth characteristic; and determine a revised angular position of the crank pulse wheel based on the first tooth characteristic and the third tooth characteristic.

* * * * *